(12) United States Patent
Shin et al.

(10) Patent No.: US 11,936,386 B2
(45) Date of Patent: Mar. 19, 2024

(54) CLOCK TRANSFER CIRCUIT INCLUDING A SEMICONDUCTOR DEVICE FOR COMPENSATING DELAY FLUCTUATION

(71) Applicants: SK hynix Inc., Icheon (KR); Seoul National University R&DB Foundation, Seoul (KR)

(72) Inventors: Soyeong Shin, Uiwang (KR); Yongjae Lee, Gwangju (KR); Jiheon Park, Seoul (KR); Deog-Kyoon Jeong, Seoul (KR)

(73) Assignees: SK hynix Inc., Icheon (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 18/298,297

(22) Filed: Apr. 10, 2023

(65) Prior Publication Data
US 2023/0246637 A1    Aug. 3, 2023

Related U.S. Application Data

(62) Division of application No. 17/316,329, filed on May 10, 2021, now Pat. No. 11,652,474.

(30) Foreign Application Priority Data

Jan. 5, 2021 (KR) .......................... 10-2021-0000669

(51) Int. Cl.
*H03K 5/135* (2006.01)
*H03K 5/00* (2006.01)

(52) U.S. Cl.
CPC ... *H03K 5/135* (2013.01); *H03K 2005/00019* (2013.01)

(58) Field of Classification Search
None
See application file for complete search history.

(56) References Cited

U.S. PATENT DOCUMENTS

| | | |
|---|---|---|
| 6,636,091 B2 | 10/2003 | Lutkemeyer |
| 8,749,269 B2 | 6/2014 | Cao |
| 9,225,319 B2 | 12/2015 | Ma et al. |
| 9,225,324 B2 | 12/2015 | Arcudia et al. |
| 11,652,474 B2 * | 5/2023 | Shin ...................... H03K 5/135 327/291 |

OTHER PUBLICATIONS

Bae, Woorham, "CMOS Inverter as Analog Circuit: An Overview", Journal of Low Power Electronics and Applications. 9. 2021-01-0526. 10.3390/jlpea9030026, 2019.

(Continued)

*Primary Examiner* — Cassandra F Cox

(57) ABSTRACT

A clock transfer circuit includes a first stage circuit configured to produce an output signal that uses a second signaling technology from an input signal that uses a first signaling technology; and a second stage circuit configured to produce a clock signal by delaying the output signal; wherein the first stage circuit includes a semiconductor device configured to compensate for delay fluctuation caused by fluctuation of power supply voltage between a first power source and a second power source.

10 Claims, 8 Drawing Sheets

(56) References Cited

OTHER PUBLICATIONS

Bikumandla, et al, "Biasing CMOS amplifiers using MOS transistors in subthreshold region", IEICE Electronic Express. 1, 10.1587/elex.1.339, 2004.

Haram Ju, "A Study on Low-Power, HighSpeed PAM-4 Transmitter with Current-Driven Feedback Driver" (Doctoral dissertation, Seoul National University). Seoul, Republic of Korea, Aug. 2019.

M. Mansuri and C.-K. K. Yang, "A low-power adaptive bandwidth PLL and clock buffer with supply-noise compensation," IEEE J. Solid-State Circuits, vol. 38, No. 11, Nov. 2003.

C. Menolfi, et al., "A 16Gb/s source-series terminated transmitter in 65nm CMOS SOI," in IEEE Int. Solid-State Circuits Conf. Dig. Tech. Papers, Feb. 2007.

S. Shin, et al, "A 0.45 pJ/b, 6.4 GB/s forwarded-clock receiver with DLL-based self-tracking loop for unmatched memory interfaces," IEEE Trans. Circuits and Syst. II: Exp. Briefs, vol. 67, No. 10, Oct. 2020.

T. Wu, et al, "An on-chip calibration technique for reducing supply voltage sensitivity in ring oscillators," IEEE J. Solid-State Circuits, vol. 42, No. 4, Apr. 2007.

Yi-Chieh Huang, et. al,"A 2.4GHz ADPLL with digital-regulated supply-noise-insensitive and temperature-self-compensated ring DCO," in IEEE Int. Solid-State Circuits Conf. Dig. Tech. Papers, Feb. 2014.

\* cited by examiner

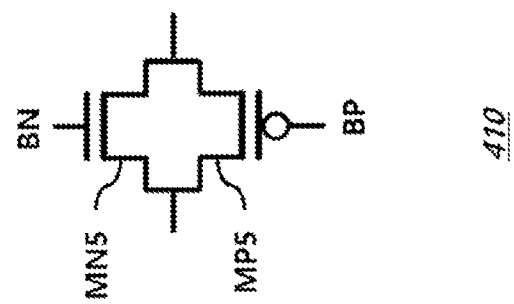

CLOCK TRANSFER CIRCUIT INCLUDING A SEMICONDUCTOR DEVICE FOR COMPENSATING DELAY FLUCTUATION

CROSS-REFERENCE TO RELATED APPLICATION

The present application is a divisional application of U.S. application Ser. No. 17/316,329, filed on May 10, 2021, which claims priority under 35 U.S.C. § 119(a) to Korean Patent Application No. 10-2021-0000669, filed on Jan. 5, 2021, which is incorporated herein by reference in its entirety.

BACKGROUND

1. Technical Field

Various embodiments generally relate to a clock transfer circuit including a semiconductor device for compensating delay fluctuation.

2. Related Art

A circuit for distributing a high-speed clock signal operates in at current mode logic (CML) levels and transmits the clock signal through a channel that may be as long as several hundred micrometers.

Such a clock signal may be converted to complementary metal-oxide-semiconductor (CMOS) levels in order to be used, for example to transmit data by a transmitter circuit or receive data by a receiver circuit.

That is, an entire clock distribution circuit may include a circuit operating at CML levels and a circuit operating at CMOS levels. Here, the signals having CML levels correspond to signals using a first signaling technology, and the signals having CMOS levels correspond to signals using a second signaling technology.

As is well known, there is a difference between CML levels and CMOS levels in the DC level of a signal or in swing width (that is, a difference high and low levels) of a signal.

At the beginning of an operation, training is performed on a clock distribution circuit so that the clock signal transitions occur at the optimal time. If the power supply voltage fluctuates, the amount of delay in the path through which the clock signal is transmitted fluctuates, which may prevent the clock signal transitions from occurring at the optimal time.

As a result, an eye characteristic of a data deteriorates due to the increase of jitter in the clock signal.

A delay locked loop (DLL) circuit may be used to solve this problem. However, the DLL circuit occupies a large area and consumes a lot of power.

SUMMARY

In accordance with an embodiment of the present disclosure, a semiconductor device may include a delay compensation circuit including a variable delay circuit configured to produce an output signal on an output node by delaying an input signal received on an input node, the delay compensation circuit being configured to compensate, according to a first bias control signal, for delay fluctuation caused by fluctuation of a power supply voltage between a first power source and a second power source; and a bias control circuit configured to generate the first bias control signal to compensate for the delay fluctuation.

In accordance with an embodiment of the present disclosure, a clock transfer circuit may include a first stage circuit configured to produce an output signal that uses a second signaling technology from an input signal that uses a first signaling technology; and a second stage circuit configured to produce a clock signal by delaying the output signal, wherein the first stage circuit includes a semiconductor device configured to compensate for delay fluctuation caused by fluctuation of power supply voltage between a first power source and a second power source.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate various embodiments, and explain various principles and advantages of those embodiments.

FIG. 8 illustrates a variable resistor according to an embodiment of the present disclosure.

DETAILED DESCRIPTION

The following detailed description references the accompanying figures in describing illustrative embodiments consistent with this disclosure. The embodiments are provided for illustrative purposes and are not exhaustive. Additional embodiments not explicitly illustrated or described are possible. Further, modifications can be made to presented embodiments within the scope of teachings of the present disclosure. The detailed description is not meant to limit this disclosure. Rather, the scope of the present disclosure is defined in accordance with claims and equivalents thereof. Also, throughout the specification, reference to "an embodiment" or the like is not necessarily to only one embodiment, and different references to any such phrase are not necessarily to the same embodiment(s).

Figure 1:
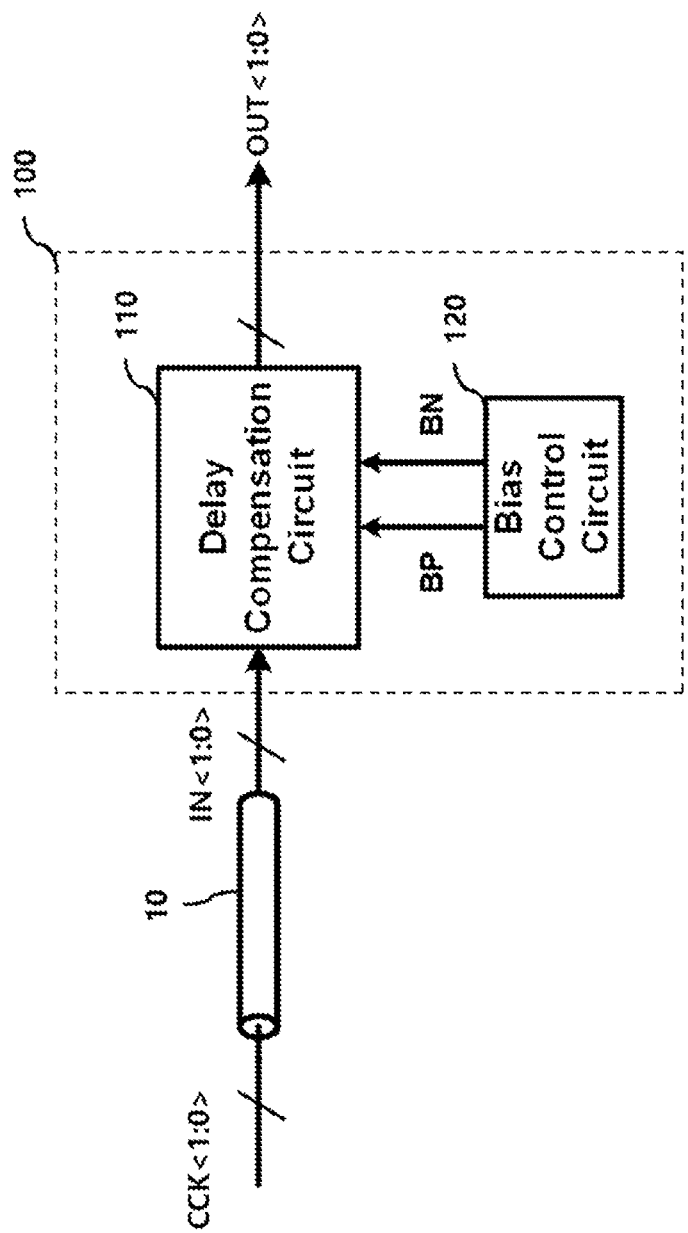
FIG. 1 illustrates a semiconductor device according to an embodiment of the present disclosure.

FIG. 1 is a block diagram illustrating a semiconductor device 100 according to an embodiment of the present disclosure.

An input clock signal CCK is transmitted through a channel 10 such as a wire, and is input to the semiconductor device 100.

An input clock signal to be input to the semiconductor device 100 after being transmitted through the channel 10 may be indicated as an input signal IN, and a signal output from the semiconductor device 100 may be indicated as an output signal OUT.

In the embodiment shown in FIG. 1, each of the input clock signal CCK, the input signal IN, and the output signal OUT is a 2-phase signal (for example, a differential pair of signals), but the number of phases is not limited thereto. In FIG. 1, the input clock signal CCK<1:0> includes a first input clock signal CCK<0> and a second input clock signal CCK<1>, the input signal IN<1:0> includes a first input signal IN<0> and a second input signal IN<1>, and the output signal OUT<1:0> includes a first output signal OUT<0> and a second output signal OUT<1>.

The semiconductor device 100 includes a delay compensation circuit 110 and a bias control circuit 120.

The delay compensation circuit 110 compensates for delay fluctuation due to fluctuation in the power supply voltage, and the bias control circuit 120 provides bias control signals BP and BN to the delay compensation circuit 110.

The delay compensation circuit 110 compensates for variations in an amount of delay by adjusting a bias current in the delay compensation circuit 110 according to the bias control signals BP and BN.

In this embodiment, signals before being input to the semiconductor device 100, that is, the input clock signal CCK and the input signal IN, are signals using CML levels, and the signal after output from the semiconductor device 100, that is, the output signal OUT, is a signal using CMOS levels.

In this embodiment, the semiconductor device 100 may perform an operation of compensating for a change of signal delay due to change in the power supply voltage while also performing an operation of converting a CML level signal to a CMOS level signal.

Figure 2:
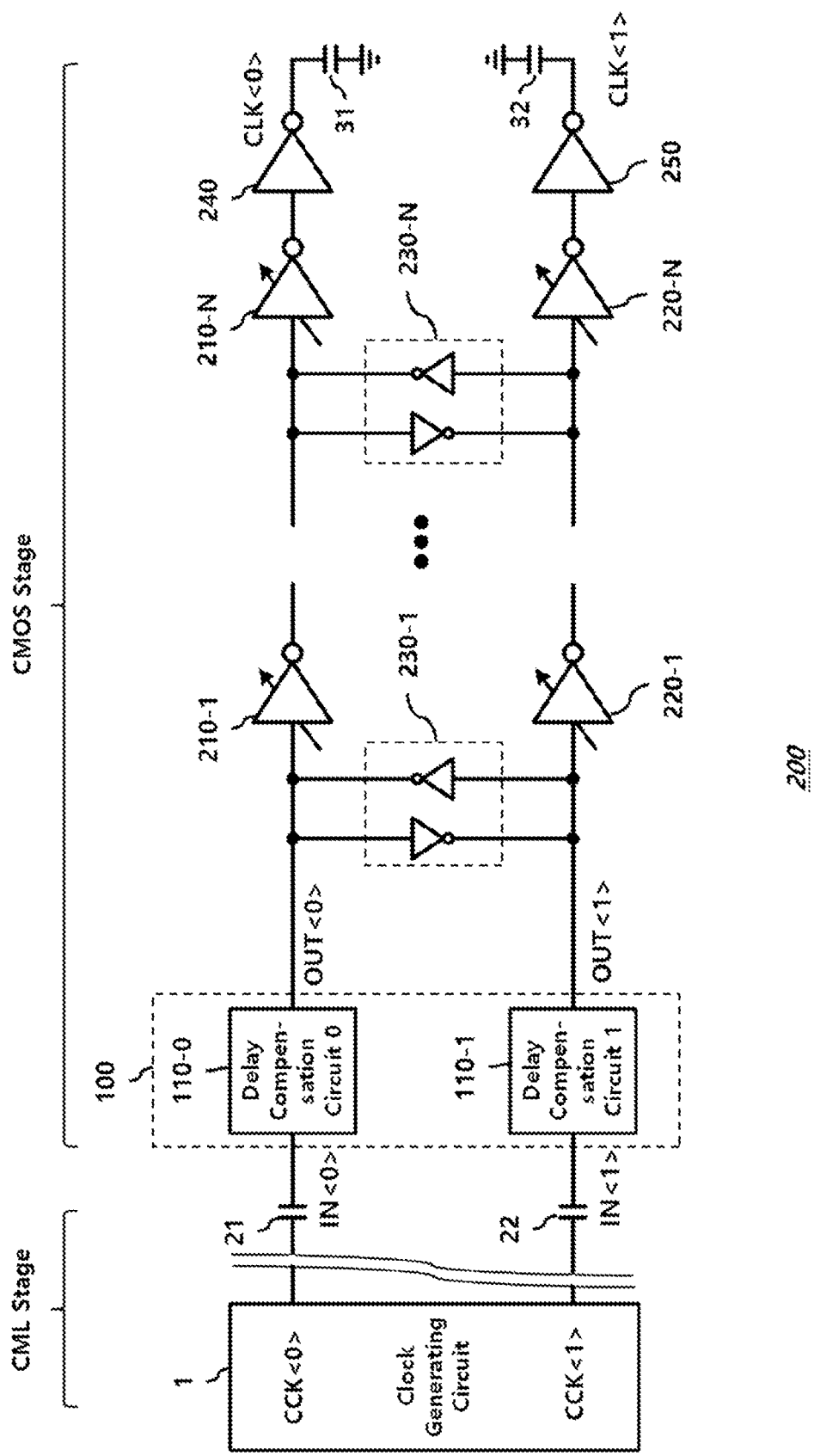
FIG. 2 illustrates a clock transfer circuit according to an embodiment of the present disclosure.

FIG. 2 is a circuit diagram showing a clock transmission circuit 200 according to an embodiment of the present disclosure.

The clock transfer circuit 200 transfers the input clock signal CCK generated by a clock generating circuit 1 to the semiconductor device 100.

As shown in FIG. 1, the input clock signal CCK may be provided to the clock generating circuit 1 through the channel 10. The clock generating circuit 1 may generate an input clock signal CCK using CML levels.

The semiconductor device 100 of FIG. 1 may be included as a part of the clock transfer circuit 200. In the semiconductor device 100 as shown in FIG. 2, the bias control circuit 120 of FIG. 1 is not shown for clarity.

The delay compensation circuit 110 compensates for a change in the amount of delay due to a change in the power supply voltage while providing the output signal OUT according to the input signal IN.

In this embodiment, the input signal IN is a CML level signal and the output signal OUT is a CMOS level signal.

Hereinafter, a circuit after the semiconductor device 100 may be referred to as a CMOS stage circuit, and a circuit before the semiconductor device 100 may be referred to as a CML stage circuit.

In addition, CML levels and CMOS levels may be referred to as first levels and second levels, and the CML stage and the CMOS stage may be referred to as a first stage and a second stage.

The present embodiment exemplifies two levels or stages represented by CML and CMOS, but the kinds of levels or stages are not limited thereto.

In FIG. 2, delay compensation circuit 110-0 receives a first input signal IN<0> corresponding to a first phase and delay compensation circuit 110-1 receives a second input signal IN<1> corresponding to a second phase.

The delay compensation circuit 110-0 outputs a first output signal OUT<0> corresponding to the first input signal IN<0>, and the delay compensation circuit 110-1 outputs a second input signal OUT<1> corresponding to the second input signal IN<1>.

The detailed configuration and operation of the delay compensation circuit 110 will be described below.

The clock transfer circuit 200 transfers the CMOS level output signal OUT through a delay line including a plurality of inverters to transfer the clock signal CLK.

The clock transfer circuit 200 may include pairs of delay lines corresponding to two phases of the input signals.

Accordingly, the clock transfer circuit 200 includes a plurality of first inverters 210-1 to 210-N that sequentially invert and delay the first output signal OUT<0>, where N is a natural number greater than 1, and a plurality of second inverters 220-1 to 220-N that sequentially invert and delay the second output signal OUT<1>.

A delay line including the plurality of first inverters 210-1 to 210-N may be referred to as a first delay line, and a delay line including the plurality of second inverters 220-1 to 220-N may be referred to as a second delay line.

The clock transfer circuit 200 may further include cross-coupled latches 230-1 to 230-N coupled between the input terminals of the corresponding first inverters 210-1 to 210-N and the second inverters 220-1 to 220-N.

The delay amounts of the first and second inverters 210-1 to 210-N and 220-1 to 220-N may be variably adjusted.

Figure 4:
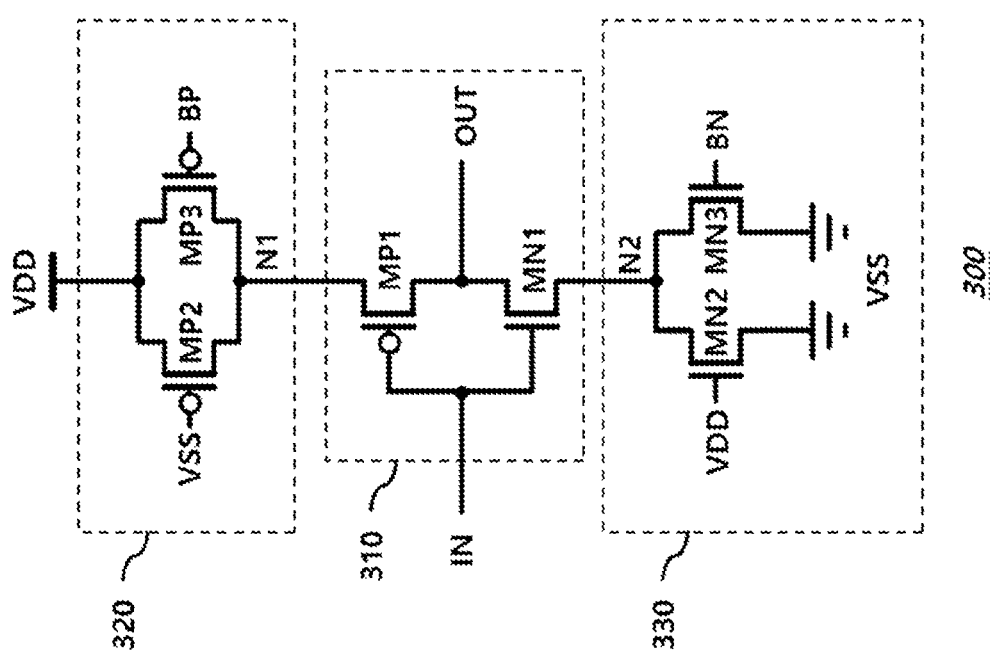
FIG. 4 illustrates a variable delay circuit according to an embodiment of the present disclosure.

In an embodiment, each of the first and second inverters 210-1 to 210-N and 220-1 to 220-N may have substantially the same structure as the variable delay circuit 300 disclosed in FIG. 4, and delay amount thereof may be adjusted according to the first bias control signal BP and the second bias control signal BN.

Accordingly, the first inverters 210-1 to 210-N may be referred to as a first variable delay circuit, and the second inverters 220-1 to 220-N may be referred to as a second variable delay circuit.

The clock transfer circuit 200 may further include a third inverter 240 and a fourth inverter 250 for outputting the clock signal CLK.

In FIG. 2, the third inverter 240 receives a signal output from the last inverter 210-N in the first delay line and outputs a first clock signal CLK<0> corresponding to the first phase, and the fourth inverter 250 receives a signal from the last inverter 220-N in the second delay line and outputs a second clock signal CLK<1> corresponding to the second phase.

The input signal IN may be input to the delay compensation circuit 110 through the coupling capacitors 21 and 22, respectively, and the first and second clock signals CLK<0> and CLK<1> produced by the clock transfer circuit 200 may be coupled to load capacitances 31 and 32, respectively.

In FIG. 2, the bias control circuit 120 is not shown for clarity, but the role of the bias control circuit is apparent from FIG. 1.

Figure 3:
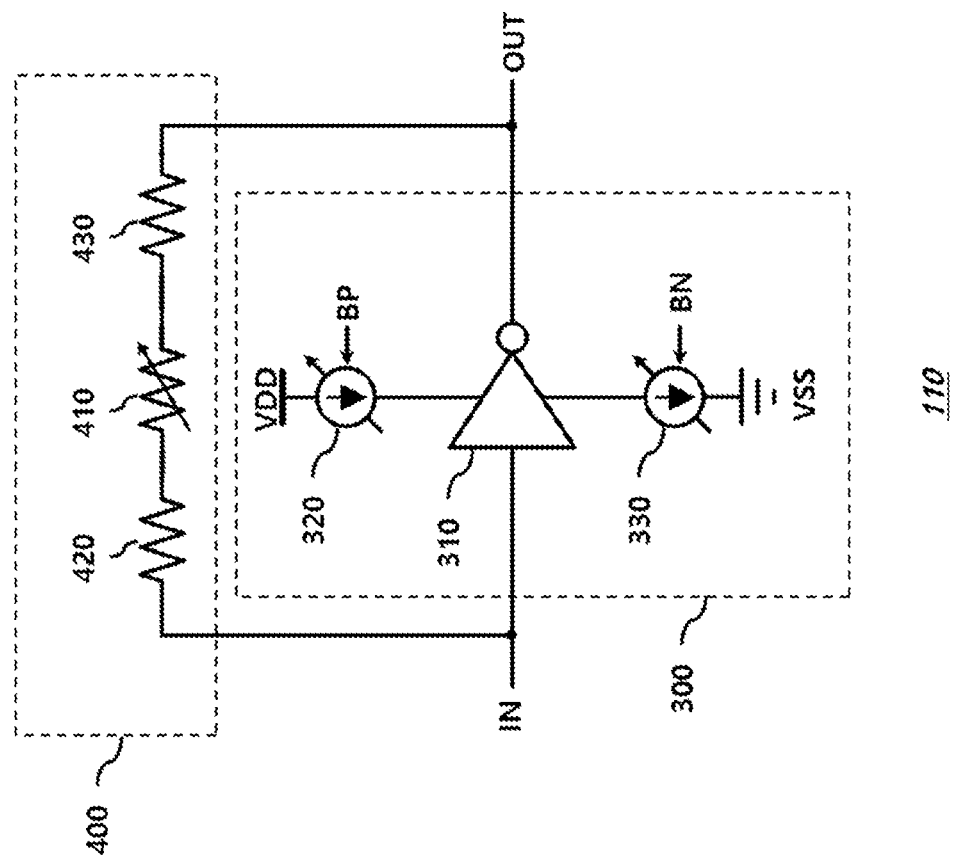
FIG. 3 illustrates a delay compensation circuit according to an embodiment of the present disclosure.

FIG. 3 is a circuit diagram showing a delay compensation circuit 110 according to an embodiment of the present disclosure.

The delay compensation circuit 110 may, for example, be incorporated into one or more of the delay compensation circuits 110-0 and 110-1 of FIG. 2, and accordingly it may be understood that the input signal IN, the output signal OUT, and the delay compensation circuit 110 may correspond to any one of a plurality of phases.

The delay compensation circuit 110 includes a variable delay circuit 300 and may also include a feedback resistor circuit 400.

The variable delay circuit 300 includes a delay element 310 and a first bias circuit 320.

The delay element 310 provides an output signal OUT by delaying the input signal IN.

In this embodiment, the delay element 310 is an inverter, but embodiments are not limited thereto.

The first bias circuit 320 adjusts a first bias current flowing from the first power source VDD to the delay element 310 according to the first bias control signal BP.

The variable delay circuit 300 may further include a second bias circuit 330 coupled between the delay element 310 and the second power source VSS.

The second bias circuit 330 adjusts a second bias current flowing from the delay element 310 to the second power source VSS according to the second bias control signal BN.

The first bias current and the second bias current may be referred to as a bias current.

The delay amount of the delay element 310 may be adjusted according to the first bias control signal BP and the second bias control signal BN.

The power supply voltage corresponds to a voltage between the first power source VDD and the second power source VSS.

FIG. 4 is a circuit diagram showing the variable delay circuit 300 in more detail.

The delay element 310 includes a first PMOS transistor MP1 and a first NMOS transistor MN1 having sources coupled at a first node N1 and a second node N2, respectively, and drains coupled in common.

The input signal IN is provided to the gates of the first PMOS transistor MP1 and the first NMOS transistor MN1, and the output signal OUT is produced at the drains of the first PMOS transistor MP1 and first NMOS transistor MN1.

The first bias circuit 320 includes second and third PMOS transistors MP2 and MP3 coupled in parallel between the first power source VDD and the first node N1.

The gate of the second PMOS transistor MP2 is coupled to the second power source VSS, and as a result the second PMOS transistor MP2 is turned on.

A first bias control signal BP is applied to the gate of the third PMOS transistor MP3 to adjust a bias current flowing from the first power source VDD to the first node N1 according to the first bias control signal BP.

When the power supply voltage increases, the bias current would normally increase.

However, when the power supply voltage increases, by increasing the first bias control signal BP, the current flowing through the third PMOS transistor MP3 is reduced and an increase that would otherwise occur of the bias current flowing from the first power source VDD to the first node N1 can be offset.

Conversely, when the power supply voltage VDD decreases, the bias current would normally decrease.

When the power supply voltage decreases, by decreasing the first bias control signal BP, the current flowing through the third PMOS transistor MP3 is increased and a decrease that would otherwise occur in the overall bias current may be offset.

The second bias circuit 330 includes second and third NMOS transistors MN2 and MN3 coupled in parallel between the second node N2 and the second power source VSS.

The gate of the second NMOS transistor MN2 is coupled to the first power source VDD and as a result the second NMOS transistor MN2 is turned on.

A second bias control signal BN is applied to the gate of the third NMOS transistor MN3, and a bias current flowing from the second node N2 to the second power source VSS is adjusted according to the second bias control signal BN.

For example, when the power supply voltage increases, by decreasing the second bias control signal BN, the current flowing through the third NMOS transistor MN3 is reduced and an increase that would otherwise occur of a bias current flowing to the second power source VSS from the second node N2 may be offset.

Conversely, when the power supply voltage decreases, by increasing the second bias control signal BN, the current flowing through the third NMOS transistor MN3 is increased and a decrease that would otherwise occur of a bias current flowing from the second node N2 to the second power VSS may be offset.

The delay amount of the delay element 310 decreases as the bias current increases, and the delay amount of the delay element 310 increases as the bias current decreases.

That is, in the present embodiment, a decrease in the delay amount of the delay element 310 can be compensated by offsetting an increase in the bias current provided to the delay element 310 according to an increase in the power supply voltage VDD and an increase in the amount of delay of the delay element 310 can be compensated by offsetting a decrease in the bias current provided to the delay element 310 according to decrease in the power supply voltage VDD.

In this case, the degree of compensation for the power-supply induced variation in the delay may be adjusted according to the first bias control signal BP and the second bias control signal BN.

Figure 5:
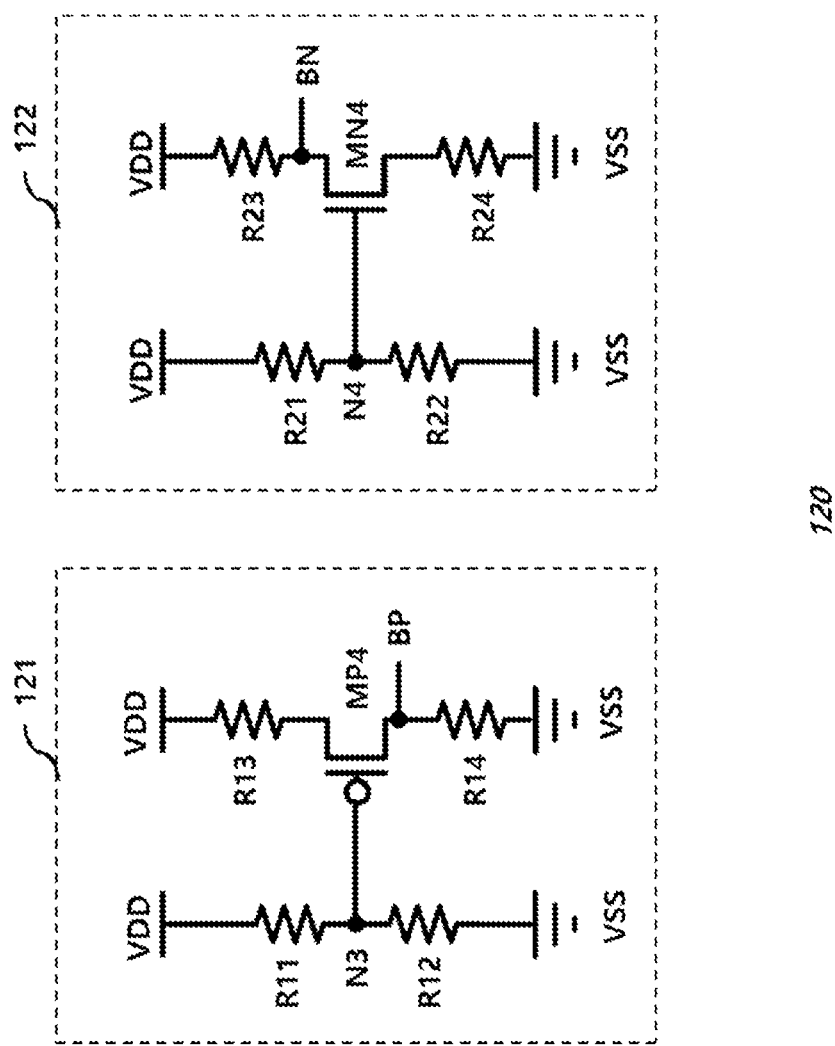
FIG. 5 illustrates a bias control circuit according to an embodiment of the present disclosure.

FIG. 5 is a circuit diagram showing the bias control circuit 120.

The bias control circuit 120 includes a first bias control subcircuit 121 providing the first bias control signal BP and a second bias control subcircuit 122 providing the second bias control signal BN.

The first bias control subcircuit 121 includes two resistors R11 and R12 coupled in series between the first power source VDD and the second power source VSS, a fourth PMOS transistor MP4 including a gate coupled to a third node N3 to which the two resistors R11 and R12 are commonly coupled, a resistor R13 coupled between the first power source VDD and a source of the fourth PMOS transistor MP4, and a resistor R14 coupled between the drain of the fourth PMOS transistor MP4 and the second power source VSS.

The first bias control signal BP is output from the drain of the fourth PMOS transistor MP4.

The second bias control subcircuit 122 includes two resistors R21 and R22 coupled in series between the first power source VDD and the second power source VSS, a fourth NMOS transistor MN4 including a gate coupled to a fourth node N4 to which the two resistors R21 and R22 are commonly coupled, a resistor R23 coupled between the first power source VDD and the drain of the fourth NMOS transistor MN4, and a resistor R24 coupled between the source of the fourth NMOS transistor MN4 and the second power source VSS.

The second bias control signal BN is output from the drain of the fourth NMOS transistor MN4.

FIGS. 6A, 6B, 7A, and 7B are graphs showing the operation of the bias control circuit 120.

The power supply voltage is represented as VDD in FIGS. 6A, 6B, 7A, and 7B.

Figures 6A, 6B:
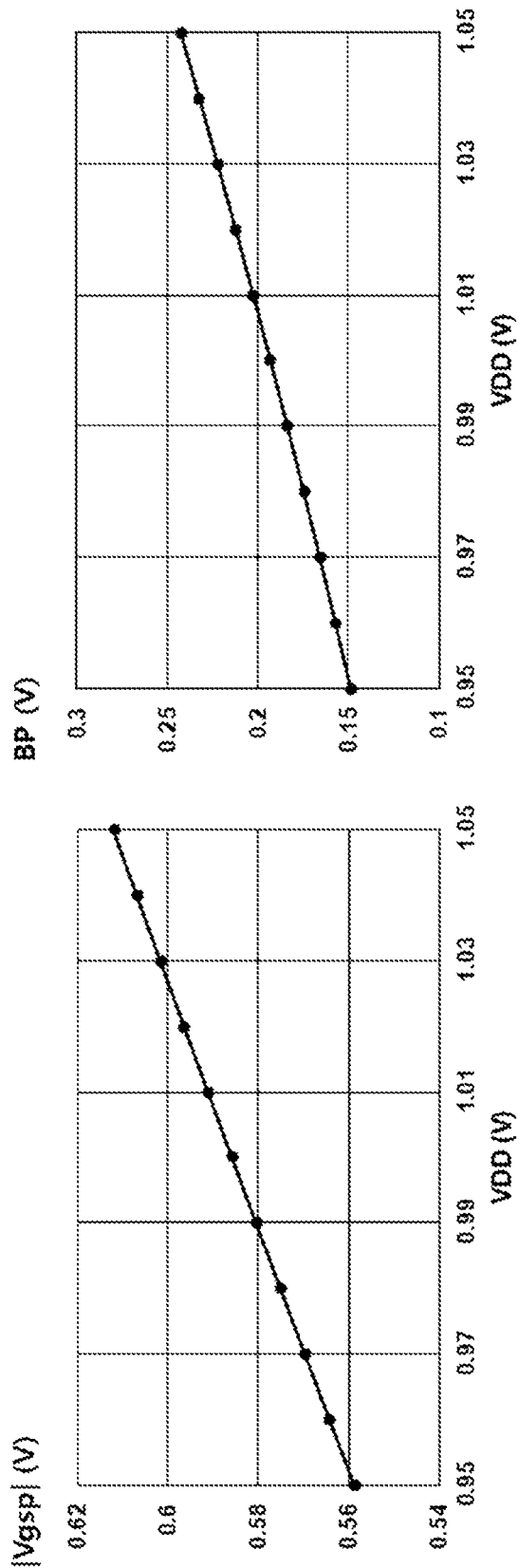
FIGS. 6A, 6B, 7A, and 7B illustrate operations of a bias control circuit according to an embodiment of the present disclosure.

FIG. 6A shows the magnitude of the gate-to-source voltage Vgsp of the fourth PMOS transistor MP4 according to the power supply voltage VDD.

The magnitude of the gate-to-source voltage of the PMOS transistor MP4 increases as the power supply voltage VDD increases.

Accordingly, as the power supply voltage VDD increases, the current flowing through the fourth PMOS transistor MP4 increases, and the magnitude of the first bias control signal BP increases as shown in FIG. 6B.

Conversely, as the power supply voltage VDD decreases, the current flowing through the fourth PMOS transistor MP4 decreases, and the magnitude of the first bias control signal BP decreases as shown in FIG. 6B.

Figure 7A:
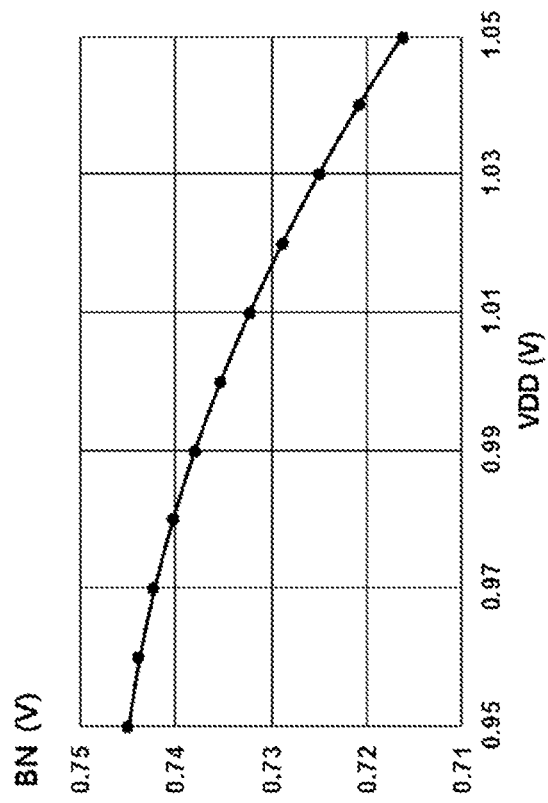

FIG. 7A shows the magnitude of the gate-to-source voltage Vgsn of the fourth NMOS transistor MN4 according to the variation of the power supply voltage VDD.

The gate-to-source voltage of the fourth NMOS transistor MN4 increases as the power supply voltage VDD increases and decreases as the power supply voltage VDD decreases.

Figure 7B:
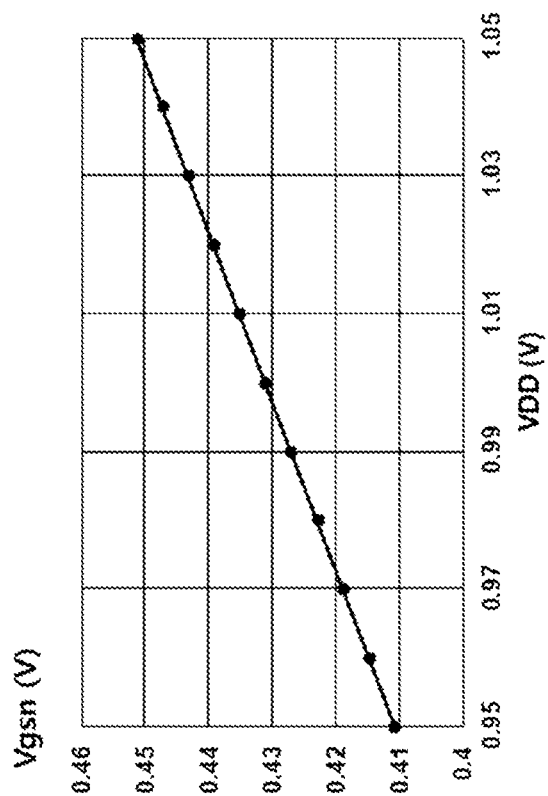

Accordingly, as the power supply voltage VDD increases, the current flowing through the fourth NMOS transistor MN4 increases, and the magnitude of the second bias control signal BN decreases as shown in FIG. 7B.

Conversely, as the power supply voltage VDD decreases, the current flowing through the fourth NMOS transistor MN4 decreases, and the magnitude of the second bias control signal BN increases as shown in FIG. 7B.

Returning to FIG. 3, the delay compensation circuit 110 may further include a feedback resistor circuit 400 coupled in parallel to the variable delay circuit 300.

The feedback resistor circuit 400 includes a variable resistor 410 and may further include first and second feedback resistors 420 and 430 coupled to the variable resistor 410.

The variable resistor 410 may be implemented using one or more MOS transistors, and the first and second feedback resistors 420 and 430 may be implemented using polysilicon.

FIG. 8 is a circuit diagram showing the variable resistor 410.

The variable resistor 410 includes a fifth PMOS transistor MP5 and a fifth NMOS transistor MN5 having respective sources coupled in common and respective drains coupled in common.

The first bias control signal BP is supplied to the gate of the fifth PMOS transistor MP5, and the second bias control signal BN is supplied to the gate of the fifth NMOS transistor MN5.

The resistance between both the coupled-together sources and the coupled-together drains of the fifth PMOS transistor MP5 and the fifth NMOS transistor MN5 may be adjusted according to the first bias control signal BP and the second bias control signal BN.

For example, when the power supply voltage increases, the first bias control signal BP increases and the second bias control signal BN decreases, thereby increasing the resistance of the variable resistor 410, and conversely, when the power supply voltage decreases, the resistance of the variable resistor 410 decreases.

When the resistance value of the feedback resistor circuit 400 increases, the swing width of the output signal OUT provided from the delay element 310 increases, and when the resistance of the feedback resistor circuit 400 decreases, swing width of the output signal OUT provided from the delay element 310 decreases.

At this time, when the swing width of the output signal OUT increases, the delay amount of the delay element 310 increases, and when the swing width of the output signal OUT decreases, the delay amount of the delay element 310 decreases.

That is, the feedback resistor circuit 400 increases the delay amount of the delay element 310 when the power voltage VDD increases, and, conversely, decreases the delay amount of the delay element 310 when the power voltage VDD decreases.

As described above, the feedback resistor circuit 400 compensates for a decrease in the amount of delay of the delay element 310 by offsetting an increase in the bias current provided to the delay element 310 as the power supply voltage increases, and an increase in the amount of delay of the delay element 310 may be compensated for by offsetting a decrease in the bias current provided to the delay element 310 as the power voltage decreases.

That is, the feedback resistor circuit 400 serves to further compensate for the decrease in the delay amount of the delay element 310 when the power supply voltage VDD increases, and serves to further compensate for the increase in the delay amount of the delay element 310 when the power supply voltage VDD decreases.

In the case of the clock transfer circuit 200, delay fluctuations according to fluctuations in the power supply voltage may occur even in the process of generating CML level signals.

If a separate compensation is not performed for the CML stage circuit, it is necessary to further compensate for the delay fluctuation in the CMOS stage circuit.

In this case, the delay fluctuation may be more strongly compensated by performing additional compensation through the feedback resistor circuit 400.

In the present embodiment, the variable resistor 410 and the variable delay circuit 300 share the same first bias control signal BP and the second bias control signal BN, but embodiments are not limited thereto, and in embodiments, the variable resistor 410 and the variable delay circuit 300 may use independent bias control signals.

For example, in an embodiment, the variable resistor 410 may be controlled by a third bias control signal BPP and a fourth bias control signal BNN which are separately generated.

In such an embodiment, the third bias control signal BPP and the fourth bias control signal BNN may have characteristics similar to the first bias control signal BP and the second bias control signal BN, respectively, but specific values can be adjusted variously.

Although various embodiments have been illustrated and described, various changes and modifications may be made to the described embodiments without departing from the spirit and scope of the invention as defined by the following claims.

What is claimed is:

1. A clock transfer circuit comprising:
   a first stage circuit configured to produce an output signal that uses a second signaling technology from an input signal that uses a first signaling technology; and
   a second stage circuit configured to produce a clock signal by delaying the output signal;
   wherein the first stage circuit includes a semiconductor device configured to compensate for delay fluctuation caused by fluctuation of power supply voltage between a first power source and a second power source.

2. The clock transfer circuit of claim 1, wherein the semiconductor device includes:
   a delay compensation circuit including a variable delay circuit configured to generate an output signal on an output node by delaying an input signal received on an input node, the delay compensation circuit being configured to compensate, according to a first bias control signal, for delay fluctuation caused by fluctuation of a power supply voltage between a first power source and a second power source; and a bias control circuit configured to generate the first bias control signal to compensate for the delay fluctuation.

3. The clock transfer circuit of claim 2, wherein the variable delay circuit comprises:

a delay element to produce the output signal by delaying the input signal; and a first bias circuit coupled to the first power source and configured to control, according to the first bias control signal, a first bias current between the first power source and the delay element, wherein the first bias circuit compensates, according to the first bias control signal, for fluctuation of the first bias current caused by fluctuation of the power supply voltage.

4. The clock transfer circuit of claim 3, further comprising a second bias circuit coupled to the second power source and configured to control a second bias current between the delay element and the second power source, wherein the second bias circuit compensates, according to the second bias control signal, for fluctuation of the second bias current caused by fluctuation of the power supply voltage.

5. The clock transfer circuit of claim 4, wherein the bias control circuit includes a first bias control subcircuit configured to provide the first bias control signal and a second bias control subcircuit configured to provide the second bias control signal, wherein the first bias control subcircuit comprises:
a first MOS transistor;
a first plurality of resistors generating gate voltage of the first MOS transistor by dividing the power supply voltage; and
a first resistor coupled to a drain of the first MOS transistor, and
wherein the first bias control signal is provided from the drain of the first MOS transistor, and wherein the second bias control subcircuit comprises:
a second MOS transistor;
a second plurality of resistors generating gate voltage of the second MOS transistor by dividing the power supply voltage; and
a second resistor coupled to a drain of the second MOS transistor, and
wherein the second bias control signal is provided from the drain of the second MOS transistor.

6. The clock transfer circuit of claim 2, wherein the delay compensation circuit further comprises a variable resistor circuit coupled between the input node and the output node and in parallel to the variable delay circuit, wherein the variable resistor circuit further compensates for delay fluctuation of the variable delay circuit.

7. The clock transfer circuit of claim 6, wherein the variable resistor circuit comprises a variable resistor whose resistance is controlled by the first bias control signal.

8. The clock transfer circuit of claim 1, wherein the first signaling technology uses current-mode-logic (CML) levels and the second signaling technology uses complementary-metal-oxide-silicon (CMOS) levels.

9. The clock transfer circuit of claim 1, wherein the second stage circuit further comprises a variable delay circuit that variably delays the output signal.

10. The clock transfer circuit of claim 1,
wherein the input signal includes a plurality of input signal phases,
wherein the output signal includes a plurality of output signal phases produced using the plurality of input signal phases, respectively, and
wherein the clock signal includes a plurality of clock signal phases produced using the plurality of output signal phases.

* * * * *